US012604758B2

(12) United States Patent
Guo et al.

(10) Patent No.: US 12,604,758 B2
(45) Date of Patent: Apr. 14, 2026

(54) CHIP PACKAGING APPARATUS AND PREPARATION METHOD THEREOF

(71) Applicant: HUAWEI TECHNOLOGIES CO., LTD., Shenzhen (CN)

(72) Inventors: Mao Guo, Shanghai (CN); Yiwei Ren, Shanghai (CN); Xiaodong Zhang, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 520 days.

(21) Appl. No.: 17/526,966

(22) Filed: Nov. 15, 2021

(65) Prior Publication Data

US 2022/0077018 A1      Mar. 10, 2022

Related U.S. Application Data

(63) Continuation of application No. PCT/CN2019/087102, filed on May 15, 2019.

(51) Int. Cl.
| | |
|---|---|
| *H01L 23/31* | (2006.01) |
| *H01L 21/56* | (2006.01) |
| *H01L 21/66* | (2006.01) |
| *H01L 23/00* | (2006.01) |
| *H01L 23/29* | (2006.01) |

(52) U.S. Cl.
CPC ........ *H01L 23/3171* (2013.01); *H01L 21/561* (2013.01); *H01L 22/20* (2013.01); *H01L 23/293* (2013.01); *H01L 24/16* (2013.01); *H01L 2224/16221* (2013.01)

(58) Field of Classification Search
None
See application file for complete search history.

(56) References Cited

U.S. PATENT DOCUMENTS

| | | |
|---|---|---|
| 2007/0267724 A1 | 11/2007 | Jeng et al. |
| 2011/0062599 A1 | 3/2011 | Kim et al. |
| 2011/0316150 A1* | 12/2011 | Ozawa .................... H01L 21/56 257/737 |

(Continued)

FOREIGN PATENT DOCUMENTS

| | | |
|---|---|---|
| CN | 101075588 A | 11/2007 |
| CN | 107636825 A | 1/2018 |

(Continued)

OTHER PUBLICATIONS

Coefficient of thermal expansion (CTE). Integrated Microfabrication Lab (cleanroom). (n.d.). https://cleanroom.byu.edu/cte_materials (Year: 2024).*

*Primary Examiner* — Jay C Chang

(57) ABSTRACT

A chip packaging apparatus and a preparation method thereof are provided, to modulate warpage of a chip, thereby resolving a problem of mismatch between a warpage degree of the chip and a warpage degree of a substrate. The chip packaging apparatus includes a chip, a substrate, and a warpage modulation structure, where a surface that is of the chip and that faces the substrate is electrically connected to the substrate, the warpage modulation structure is disposed on a surface that is of the chip and that is opposite to the substrate, and a coefficient of thermal expansion of the warpage modulation structure is greater than a coefficient of thermal expansion of the chip.

14 Claims, 9 Drawing Sheets

Chip packaging apparatus 300

| | |
|---|---|
| ▭ | Chip 301 |
| ▥ | Substrate 302 |
| ▨ | Warpage modulating structure 303 |
| ▦ | Bump 304 |

(56)             References Cited

U.S. PATENT DOCUMENTS

| | | | | |
|---|---|---|---|---|
| 2014/0061891 A1* | 3/2014 | Kim | ..................... | H01L 23/562 |
| | | | | 438/126 |
| 2014/0145324 A1* | 5/2014 | Uchibori | ................ | H01L 23/48 |
| | | | | 257/737 |
| 2015/0235902 A1 | 8/2015 | Tsai et al. | | |
| 2019/0006341 A1* | 1/2019 | Lin | ...................... | H01L 21/563 |
| 2019/0164907 A1* | 5/2019 | Chen | ................ | H01L 23/49827 |
| 2020/0343197 A1* | 10/2020 | Chen | .................. | H01L 23/3135 |

FOREIGN PATENT DOCUMENTS

| | | |
|---|---|---|
| CN | 108183065 A | 6/2018 |
| CN | 109037164 A | 12/2018 |

* cited by examiner

Substrate warpage                    Chip warpage

Chip 201                          Bump 201a

Substrate 202

Chip 301

Substrate 302

Warpage modulating structure 303

Bump 304

Chip packaging apparatus 300

303

301

302

304

Chip packaging apparatus 300

303
301a
301b
301c
304
302

303
301 a 303
301 b 303
301 c 303
301 d

Chip 301

Warpage modulating
structure 303

Top view

303a

301

Front view

303a

301

First modulating
strip 303a

Chip 301

S1001

Perform lamination or spinner coating of a
polymer film on a back side of a wafer

S1002

Perform exposure, development, or laser cutting
on the polymer film to form a warpage
modulating structure

S1003

Cut, clean, and package the wafer to form a chip
packaging apparatus

CHIP PACKAGING APPARATUS AND PREPARATION METHOD THEREOF

CROSS-REFERENCE TO RELATED APPLICATIONS

This application is a continuation of International Application No. PCT/CN2019/087102, filed on May 15, 2019, the disclosure of which is hereby incorporated by reference in its entirety.

TECHNICAL FIELD

This application relates to the field of semiconductor technologies, and in particular, to a chip packaging apparatus and a preparation method thereof.

BACKGROUND

With development of electronics technologies, electronic products are being developed to be smaller and thinner, chips and substrates are becoming thinner in chip packaging. Chip warpage is more likely due to thinning of the chips and the substrates and a more difficult problem. Chips are mainly made from two types of materials: silicon and copper. A coefficient of thermal expansion (CTE) of the copper is far greater than a coefficient of thermal expansion of the silicon. Therefore, when reflow is performed on a chip packaging apparatus (including a chip and a substrate), an amount expansion or warping of a surface of the chip that has more copper is far greater than an expansion of a different composition such as a chip surface having less copper. Consequently, the chip warping from the surface having more copper in relation to a chip substrate, creates a serious problem.

The substrate is mainly made from materials such as fiberglass and resin. CTE differences among these materials are small, so that a warpage degree of the substrate is usually less serious than a warpage degree of the chip, as shown in FIG. 1. A thinner chip and a thinner substrate result in a more serious mismatch between warpage degrees thereof.

A mismatch between the warpage degree of the chip and the warpage degree of the substrate results in welding failure of the chip (to be specific, flip chip bond nonwetting), as shown in FIG. 2. In FIG. 2, a chip 201 is electrically connected to a substrate 202 by using bumps 201a on the chip 201, the chip 201 warps from a surface on which the bumps 201a are distributed on a surface that is opposite to the surface, and a warpage degree is serious. Because CTE differences among materials included in the substrate 202 are small, a warpage degree of the substrate 202 is small. Because a warpage degree of the chip 201 is inconsistent with the warpage degree of the substrate 202, when the chip 201 and the substrate 202 are welded, the bumps 201a on the chip 201 hardly come into contact with the substrate 202. Consequently, the chip 201 and the substrate 202 cannot be welded together.

In the conventional technology; to resolve a problem of warping mismatch between the the chip substrate is addressed by modulating the warping of the substrate. For example, thicknesses of components such as a solder resist (SR) layer, a copper layer, and a dielectric layer of the substrate may be modulated. Because CTEs of different components are different, the degree of the substrate warping may be changed by modulating the thicknesses of different components.

However, the foregoing solution has the following problems: As the substrate is become lighter and thinner, material specifications of components of an ultra-thin substrate have reached limits of adjustability. The ability to properly modulate for warping is limited because the reduced thickness of the substrate limits a range of possible modulations. As a result, it is increasingly difficult to well solve the warping mismatch problem due to the mismatch between the degree the chip warpage and the substrate warpage in view of there being increasingly thinner chips.

In conclusion, the solution provided in the conventional technology has limited modulation of the substrate warpage, and it is difficult to effectively resolve the problem of mismatch between the warpage degree of the chip and the warpage degree of the substrate.

SUMMARY

Embodiments of the present disclosure provide a chip packaging apparatus and a preparation method thereof, to reduce a warping mismatch between chip surface and substrate warping.

According to a first aspect, an embodiment of this disclosure provides a chip packaging apparatus. The chip packaging apparatus includes a chip, a substrate, and a warpage modulation structure in which a surface of the chip and that faces the substrate is electrically connected to the substrate, the warpage modulation structure is disposed on a surface that is of the chip and that is opposite to the substrate, and a coefficient of thermal expansion of the warpage modulation structure is greater than a coefficient of thermal expansion of the chip. A material of the warpage modulating structure may be a polymer material, for example, may be polyimide, epoxy, or phenolic aldehyde.

In the chip packaging apparatus, because the coefficient of thermal expansion of the warpage modulation structure is greater than the coefficient of thermal expansion of the chip, in a reflow process of the chip packaging apparatus, the warpage modulation structure disposed on the surface that is of the chip and that is opposite to the substrate is expanded with heat. Compared with an expansion degree in the conventional technology, an expansion degree of the surface that is of the chip and that is opposite to the substrate becomes larger, thereby modulation warpage of the chip in a direction from the surface that faces the substrate to the surface that is opposite to the substrate. In other words, a warpage degree of the chip is decreased. Therefore, the warpage degree of the chip is close to a warpage degree of the substrate, and a problem of mismatch between the warpage degree of the chip and the warpage degree of the substrate is alleviated.

In a possible design, the coefficient of thermal expansion of the warpage modulation structure may be greater than a coefficient of thermal expansion of a metal layer of the chip. According to this solution, the coefficient of thermal expansion of the warpage modulation structure is further increased, and therefore, a modulation effect on the warpage of the chip can be improved.

In the chip packaging apparatus provided in the first aspect, the warpage modulation structure may be a layer-shaped structure, or may be a strip-shaped structure or a mesh-shaped structure. If the warpage modulation structure is a layer-shaped structure, the layer-shaped structure includes at least one modulation block. For example, the layer-shaped structure may be a polymer layer disposed on the surface that is of the chip and that is opposite to the substrate. When the warpage modulation structure is the layer-shaped structure, the warpage modulation structure may uniformly modulate the warpage degree of the chip within a coverage area of the warpage modulation structure.

If the warpage modulation structure is a strip-shaped structure or a mesh-shaped structure, the warpage modulation structure may have different implementations based on different forms of the warpage modulation structure. When the warpage modulation structure is the strip-shaped structure or the mesh-shaped structure, different forms of the strip-shaped structure or the mesh-shaped structure may be used to implement different degrees of modulation on the warpage of the chip, and implement modulation on warpage of different locations of the chip. For example, the warpage modulation structure may have the following three implementations.

In implementation 1, the warpage modulation structure is a strip-shaped structure, and the warpage modulation structure includes a plurality of first modulation strips arranged in parallel. According to implementation 1, warpage of the chip in a direction parallel to the first modulation strips can be modulated.

In a possible design, the plurality of first modulation strips may be arranged with equal spacings, and the plurality of first modulation strips may be parallel to two edges of the chip.

In implementation 2, the warpage modulation structure is a mesh-shaped structure, the warpage modulation structure includes a plurality of first modulation strips arranged in parallel and a plurality of second modulation strips arranged in parallel, and the plurality of first modulation strips respectively intersect with the plurality of second modulation strips. According to implementation 2, warpage of the chip in a direction parallel to the plurality of first modulation strips and in a direction parallel to the plurality of second modulation strips can be modulated.

The plurality of first modulation strips may be respectively perpendicular to the plurality of second modulation strips. According to this solution, warpage of the chip in two mutually perpendicular directions can be modulated.

In a possible design, the plurality of first modulation strips may be arranged with equal spacings, the plurality of first modulation strips may be parallel to two edges of the chip, and the plurality of second modulation strips may be arranged with equal spacings.

In implementation 3, the warpage modulation structure is a mesh-shaped structure, and the warpage modulation structure includes a plurality of first modulation strips arranged in parallel and a plurality of second modulation strips arranged in parallel: the plurality of first modulation strips are respectively perpendicular to the plurality of second modulation strips, and the plurality of first modulation strips are parallel to two edges of the chip; and some second modulation strips in the plurality of second modulation strips intersect with some first modulation strips in the plurality of first modulation strips. According to implementation 3, warpage of the chip in a direction parallel to the plurality of second modulation strips and in a direction parallel to the plurality of first modulation strips can be modulated. In addition, twist of the chip can be further modulated.

In a possible design, the plurality of first modulation strips may be arranged with equal spacings.

According to a second aspect, an embodiment of the present disclosure provides a chip packaging apparatus preparation method, to prepare the chip packaging apparatus provided in the first aspect. The method includes the following steps: performing lamination or spinner coating of a polymer film on a back side of a wafer: performing exposure, development, or laser cutting on the polymer film to form a warpage modulation structure, where a coefficient of thermal expansion of the warpage modulation structure is greater than a coefficient of thermal expansion of the wafer; and cutting, cleaning, and packaging the wafer to form the chip packaging apparatus. In the chip packaging apparatus prepared by using this preparation method, the warpage modulation structure is formed on the back side of the wafer. After the wafer is cut, cleaned, and packaged, a plurality of chip packaging apparatuses may be formed, and a warpage modulation structure is disposed on a back side of a chip in each chip packaging apparatus. Because the coefficient of thermal expansion of the warpage modulation structure is greater than the coefficient of thermal expansion of the wafer, in a reflow process of the chip packaging apparatus, the warpage modulation structure disposed on a surface that is of the chip and that is opposite to a substrate is expanded with heat. Compared with an expansion degree in the conventional technology, an expansion degree of the surface that is of the chip and that is opposite to the substrate becomes larger, thereby modulation warpage of the chip in a direction from a surface that faces the substrate to the surface that is opposite to the substrate. In other words, a warpage degree of the chip is decreased. Therefore, the warpage degree of the chip is close to a warpage degree of the substrate, and a problem of mismatch between the warpage degree of the chip and the warpage degree of the substrate is alleviated.

In a possible design, before the performing lamination or spinner coating of a polymer film on a back side of a wafer, the method further includes: separately measuring a warpage degree of a substrate and a warpage degree of a chip: determining a mismatch degree based on the warpage degree of the substrate and the warpage degree of the chip; and determining a material type and a shape feature of the warpage modulation structure based on the mismatch degree. According to this solution, the material type and the shape feature of the warpage modulation structure are determined based on the mismatch degree between the warpage degree of the substrate and the warpage degree of the chip. After the warpage modulation structure determined in this manner modulates the warpage degree of the chip, the warpage degree of the chip may be closer to the warpage degree of the substrate, thereby better alleviating the problem of mismatch between the warpage degree of the chip and the warpage degree of the substrate.

In a possible design, the performing exposure, development, or laser cutting on the polymer film to form a warpage modulation structure may be implemented in the following manner: performing exposure, development, or laser cutting on the polymer film to form a strip-shaped structure. In other words, the warpage modulation structure is a strip-shaped structure. Specifically, the strip-shaped structure includes a plurality of first modulation strips arranged in parallel. The warpage modulation structure formed by using this solution may modulate warpage of the chip in the chip packaging apparatus in a direction parallel to the first modulation strips.

In a possible design, the performing exposure, development, or laser cutting on the polymer film to form a warpage modulation structure may be implemented in the following manner: performing exposure, development, or laser cutting on the polymer film to form a mesh-shaped structure. In other words, the warpage modulation structure is a mesh-shaped structure. Specifically; the mesh-shaped structure includes a plurality of first modulation strips arranged in parallel and a plurality of second modulation strips arranged in parallel, and the plurality of first modulation strips respectively intersect with the plurality of second modulation strips. The warpage modulation structure formed by using this solution may modulate warpage of the chip in the chip packaging apparatus in a direction parallel to the plurality of first modulation strips and in a direction parallel to the plurality of second modulation strips.

In a possible design, the performing exposure, development, or laser cutting on the polymer film to form a warpage modulation structure may be implemented in the following manner: performing exposure, development, or laser cutting on the polymer film to form a mesh-shaped structure. In other words, the warpage modulation structure is a mesh-shaped structure. Specifically, the mesh-shaped structure includes a plurality of first modulation strips arranged in parallel and a plurality of second modulation strips arranged in parallel: the plurality of first modulation strips are respectively perpendicular to the plurality of second modulation strips, and the plurality of first modulation strips are parallel to two edges of the chip; and some second modulation strips in the plurality of second modulation strips intersect with some first modulation strips in the plurality of first modulation strips. The warpage modulation structure formed by using this solution can not only modulate warpage of the chip in the chip packaging apparatus in a direction parallel to the plurality of first modulation strips and in a direction parallel to the plurality of second modulation strips, but also modulate twist of the chip.

In addition, for another implementation of the warpage modulation structure, refer to related descriptions in the chip packaging apparatus provided in the first aspect. Details are not described herein again.

It should be noted that, the chip packaging apparatus preparation method provided in the second aspect is used to prepare the chip packaging apparatus provided in the first aspect. Therefore, for implementations and technical effects that are not described in detail in the preparation method provided in the second aspect, refer to the related descriptions in the chip packaging apparatus provided in the first aspect. Details are not described herein again.

DESCRIPTION OF EMBODIMENTS

Based on the problems raised in the background, the embodiments of the present disclosure provide a chip packaging apparatus and a preparation method thereof, to modulate warpage of a chip, thereby resolving a problem of mismatch between a warpage degree of the chip and a warpage degree of a substrate.

It should be noted that, in the embodiments of the present disclosure, "at least one" means one or more, and "a plurality of" means two or more. In addition, it should be understood that in the descriptions of the present disclosure, terms such as "first" and "second" are merely used for distinguishing and description, but should not be understood as indicating or implying relative importance, or should not be understood as indicating or implying a sequence.

The following further describes in detail the embodiments of the present disclosure with reference to the accompanying drawings.

Figures 1, 2:
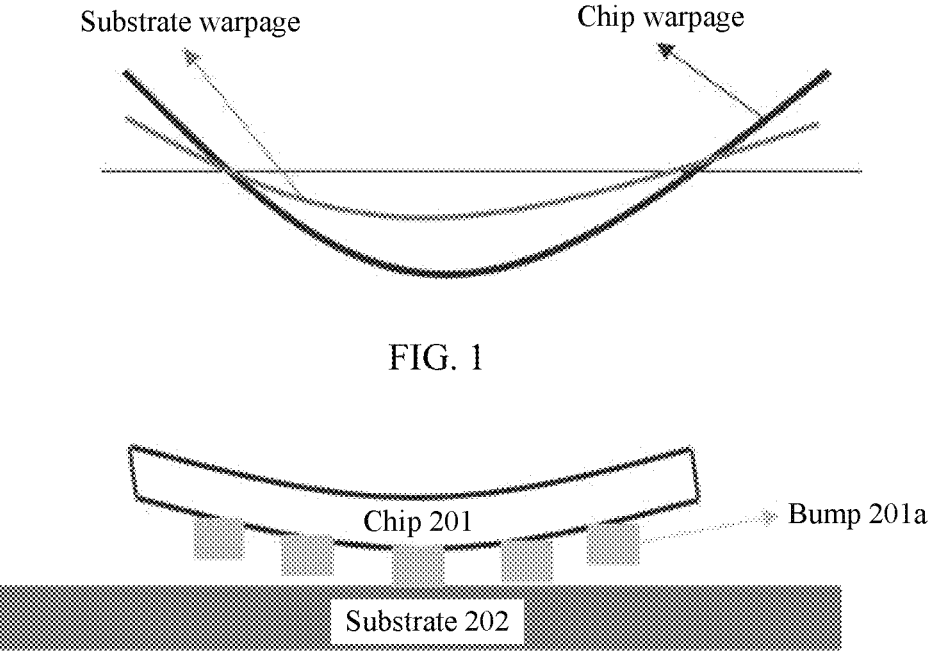
FIG. 1 is a schematic diagram of a comparison between a warpage degree of a chip and a warpage degree of a substrate according to the conventional technology.
FIG. 2 is a schematic diagram of chip welding according to the conventional technology.
Figure 3:
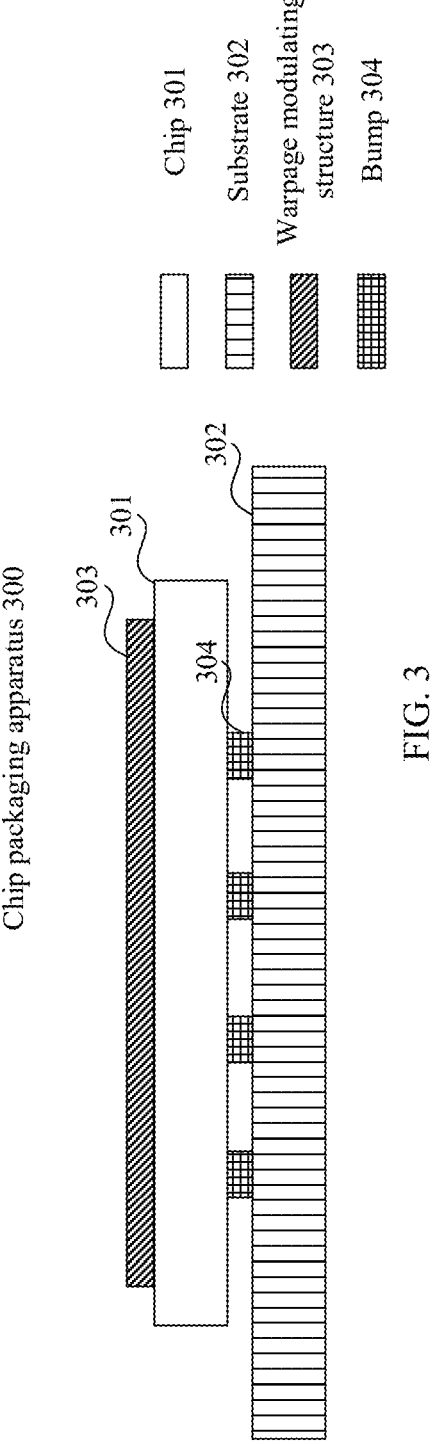
FIG. 3 is a schematic cross-sectional diagram of a chip packaging apparatus according to an embodiment of the present disclosure.

FIG. 3 is a schematic cross-sectional diagram of a chip packaging apparatus 300 according to an embodiment of the present disclosure. The chip packaging apparatus 300 includes a chip 301, a substrate 302, and a warpage modulation structure 303.

A surface that is of the chip 301 and that faces the substrate 302 is electrically connected to the substrate 302, the warpage modulation structure 303 is disposed on a surface that is of the chip 301 and that is opposite to the substrate 302, and a coefficient of thermal expansion of the warpage modulation structure 303 is greater than a coefficient of thermal expansion of the chip 301.

The chip 301 may be considered as a die. In this embodiment of the present disclosure, a package structure of the chip 301 and the substrate 302 is not specifically limited. In the schematic diagram of FIG. 3, the chip packaging apparatus 300 further includes bumps 304, and the chip 301 is connected to the substrate 302 by using the bumps 304.

Figures 4, 5:
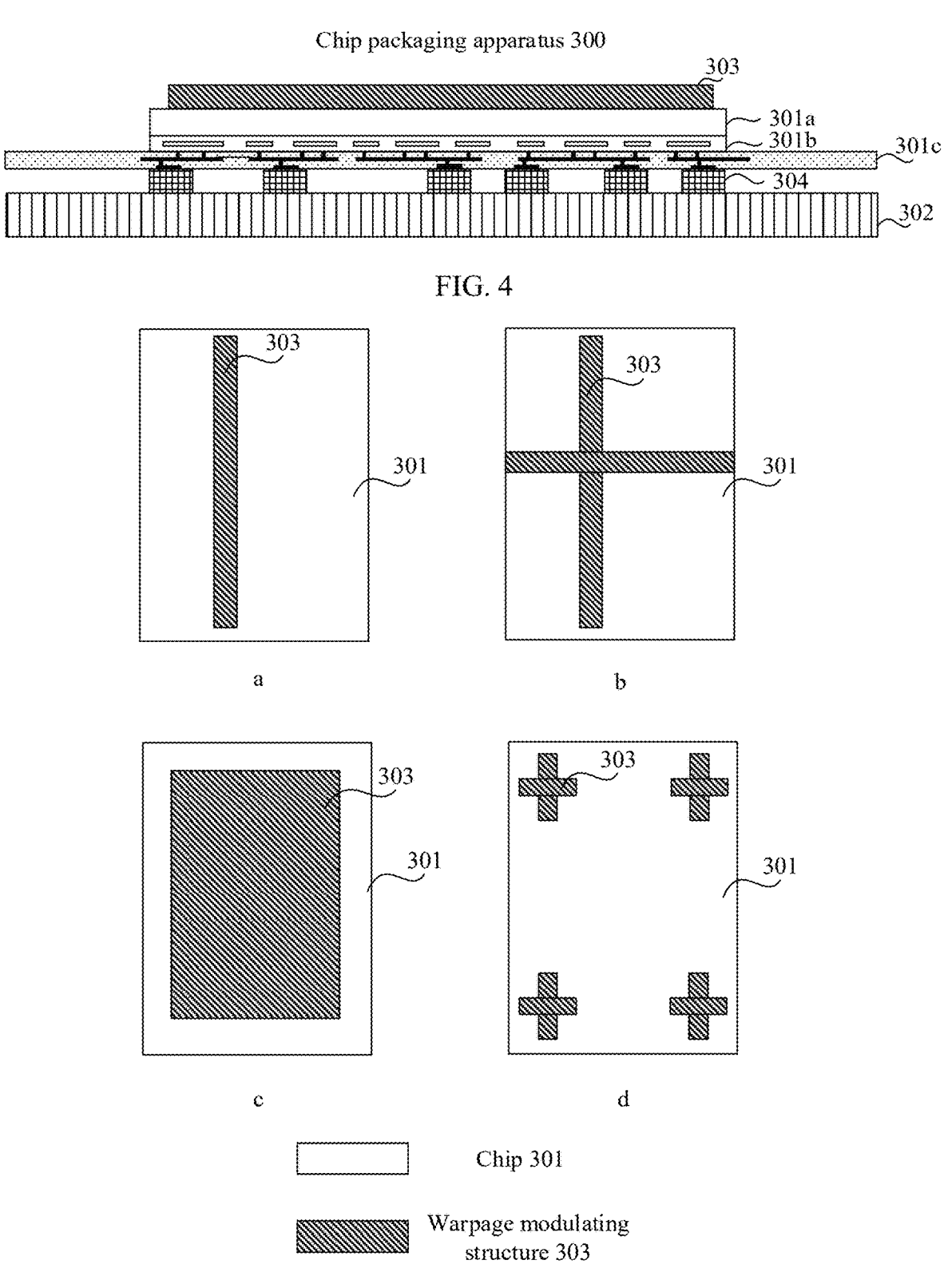
FIG. 4 is another schematic cross-sectional diagram of a chip packaging apparatus according to an embodiment of the present disclosure.
FIG. 5 is a schematic diagram of distribution of a first warpage modulation structure 303 on a chip 301 according to an embodiment of the present disclosure.

In a detailed implementation, a schematic cross-sectional diagram of a possible structure of the chip packaging apparatus 300 may be shown in FIG. 4. In FIG. 4, after pins are fanned out by using a wiring layer 301c, the chip 301 is electrically connected to the substrate 302 by using the bumps 304. The chip 301 includes a Si substrate 301a, an active layer 301b, and the wiring layer 301c. The active layer 301b is connected to the wiring layer 301c, and the Si substrate 301a is located on a surface that is of the active layer 301b and that is opposite to the wiring layer 301c. The Si substrate 301a is mainly made from silicon, the active layer 301b is mainly made from copper, and the wiring layer 301c may be made from silicon and metal materials such as copper and aluminum. Because the metal materials in the active layer 301b and the wiring layer 301c account for a high proportion, in this embodiment of the present disclosure, the active layer 301b and the wiring layer 301c may be collectively referred to as a metal layer. In addition, the warpage modulation structure 303 is disposed on the surface that is of the chip 301 and that is opposite to the substrate 302.

Certainly, in this embodiment of the present disclosure, the package structure of the chip 301 and the substrate 302 is not limited to the solution shown in FIG. 4. Another package structure in the conventional technology is also applicable to this application, for example, a die wire bond package, a fan out package, or a fan in package.

For example, a material of the warpage modulation structure 303 may be a polymer material, for example, polyimide (PI), epoxy, or phenolic aldehyde. The polymer material has a high coefficient of thermal expansion, and it is proved in practice that the polymer material may be well bonded to the chip 301.

In addition, in this embodiment of the present disclosure, a thickness of the warpage modulation structure 303 may be designed based on a requirement. For example, a polymer layer with a specific thickness may be pre-selected, and a layer-shaped, strip-shaped, or mesh-shaped warpage modulation structure 303 is formed in a manner of performing exposure, development, or laser cutting on the polymer layer, where the thickness of the warpage modulation structure 303 is a thickness of the pre-selected polymer layer.

Similarly, a thickness of the chip 301 and a thickness of the substrate 302 are not limited in this embodiment of the present disclosure. In particular, when the chip 301 is an ultra-thin chip, warpage of the chip 301 is serious, and a difference between a warpage degree of the chip 301 and a warpage degree of the substrate 302 is greater. The warpage of the chip 301 may be greatly alleviated by using the chip packaging apparatus provided in this embodiment of the present disclosure, so that the warpage degree of the chip 301 is close to the warpage degree of the substrate 302, thereby alleviating a problem of mismatch between the warpage degree of the chip 301 and the warpage degree of the substrate 302.

In this embodiment of the present disclosure, the warpage modulation structure 303 is disposed on the surface that is of the chip 301 and that is opposite to the substrate 302, to modulate the warpage of the chip 301. In the conventional technology, because a CTE of copper is far greater than a CTE of silicon, when reflow is performed on the chip packaging apparatus, an expansion degree of the surface that is of the chip and that faces the substrate is far greater than an expansion degree of the surface that is of the chip and that is opposite to the substrate, resulting in serious warpage of the chip. In addition, because CTE differences among materials included in the substrate are small, the warpage degree of the substrate is less serious than the warpage degree of the chip, resulting in the problem of mismatch between the warpage degree of the substrate and the warpage degree of the chip. In this embodiment of the present disclosure, the warpage modulation structure 303 whose coefficient of thermal expansion is greater than the coefficient of thermal expansion of the chip 301 is disposed on the surface that is of the chip 301 and that is opposite to the substrate 302, and an expansion degree of the warpage modulation structure 303 is large in a reflow process. To be specific, compared with an expansion degree in the conventional technology, the expansion degree of the surface that is of the chip 301 and that is opposite to the substrate 302 is increased, thereby modulation warpage of the chip 301 in a direction from the surface that faces the substrate 302 to the surface that is opposite to the substrate 302. In other words, the warpage degree of the chip 301 is decreased. Further, in this embodiment of the present disclosure, because the warpage degree of the chip 301 is decreased, the warpage degree of the chip 301 is closer to the warpage degree of the substrate 302 compared with a warpage degree in the conventional technology, so that the problem of mismatch between the warpage degree of the chip 301 and the warpage degree of the substrate 302 is alleviated. In addition, because the warpage degree of the chip 301 is decreased, overall warpage of the chip packaging apparatus 300 may be further alleviated by using the solution provided in this embodiment of the present disclosure.

In the chip packaging apparatus 300, that the coefficient of thermal expansion of the warpage modulation structure 303 is greater than the coefficient of thermal expansion of the chip 301 may be understood as follows: The coefficient of thermal expansion of the warpage modulation structure 303 is greater than an average coefficient of thermal expansion of the materials included in the chip 301. When the coefficient of thermal expansion of the warpage modulation structure 303 is greater than the coefficient of thermal expansion of the chip 301, the warpage modulation structure 303 may modulate the warpage of the chip 301. Further, the coefficient of thermal expansion of the warpage modulation structure 303 may be greater than a coefficient of thermal expansion of the metal layer of the chip. According to this implementation, the coefficient of thermal expansion of the warpage modulation structure 303 is further increased, and therefore, a modulation effect on the warpage of the chip 301 can be improved.

It should be understood that, in this embodiment of the present disclosure, the surface that is of the chip 301 and that faces the substrate 302 is electrically connected to the substrate 302, so that the metal layer is usually distributed on the surface that is of the chip 301 and that faces the substrate 302. During specific implementation, the metal layer may include an active layer and a wiring layer. For example, in the example of FIG. 4, the metal layer may include the active layer 301b and the wiring layer 301c.

In this embodiment of the present disclosure, a structure of the warpage modulation structure 303 is not specifically limited. In a possible example, the warpage modulation structure 20) 303 may be a layer-shaped structure, for example, may be a polymer layer disposed on the surface that is of the chip 301 and that is opposite to the substrate 302. In another possible example, the warpage modulation structure 303 may be a strip-shaped structure or a mesh-shaped structure.

The layer-shaped structure may be understood as follows: The layer-shaped structure may include at least one modulation block. For example, the modulation block may be a polymer layer. If the warpage modulation structure 303 includes one modulation block, the modulation block may cover a partial area of the surface that is of the chip 301 and that is opposite to the substrate 302, or may cover a complete area of the surface that is of the chip 301 and that is opposite to the substrate 302: or if the warpage modulation structure 303 includes a plurality of modulation blocks, a positional relationship of the plurality of modulation blocks is not specifically limited in this embodiment of the present disclosure.

The strip-shaped structure and the mesh-shaped structure may be understood as follows: The strip-shaped structure may include a plurality of modulation strips, and the plurality of modulation strips do not intersect with each other. The mesh-shaped structure may include a plurality of modulation strips, and the plurality of modulation strips intersect with each other.

FIG. 5 is a schematic diagram (top view) of distribution of several warpage modulation structures on the chip 301. In example a, the warpage modulation structure 303 is a strip-shaped structure that includes only one modulation strip. In example b, the warpage modulation structure 303 is a mesh-shaped structure that includes two modulation strips. In example c, the warpage modulation structure 303 is a layer-shaped structure that covers only a partial area of the surface that is of the chip 301 and that is opposite to the substrate 302. In example d, the warpage modulation structure 303 includes a plurality of modulation strips, and two modulation strips intersected with each other are distributed on each of four corners of the chip 301.

Certainly, the foregoing examples are merely several possible implementations of the warpage modulation structure 303. In actual application, the warpage modulation structure 303 is not limited to the structures in the foregoing examples.

During specific implementation, because the warpage modulation structure 303 is disposed to decrease the warpage degree of the chip 301 so that the warpage degree of the chip 301 tends to be the same as the warpage degree of the substrate 302, a specific form/pattern of the warpage modulation structure 303 may be set based on a warpage form of the substrate 302. For example, if the substrate 302 is warped into a regular bowl shape, the warpage modulation structure 303 may be disposed as a corresponding symmetrical strip-shaped structure or a corresponding symmetrical mesh-shaped structure: or if twist of the substrate 302 is serious, modulation strips in the warpage modulation structure 303 may be disposed densely at a corresponding location of the twist, thereby more greatly alleviating the twist.

In other words, warpage/twist in any direction or at a part of the chip 301 may be modulated by disposing the warpage modulation structure 303 on the surface that is of the chip 301 and that is opposite to the substrate 302, so that the warpage degree of the chip 301 and the warpage degree of the substrate 302 are more matched. Therefore, a welding failure problem between the chip 301 and the substrate 302 is alleviated, and warpage of the chip packaging apparatus 300) is alleviated.

The following lists some specific implementations of the warpage modulation structure 303. It may be understood that, the warpage modulation structure 303 in this embodiment of the present disclosure may be designed into different forms/patterns based on the warpage form of the substrate 302, and implementations thereof are not limited to the following listed manners.

Implementation 1

Figure 6:
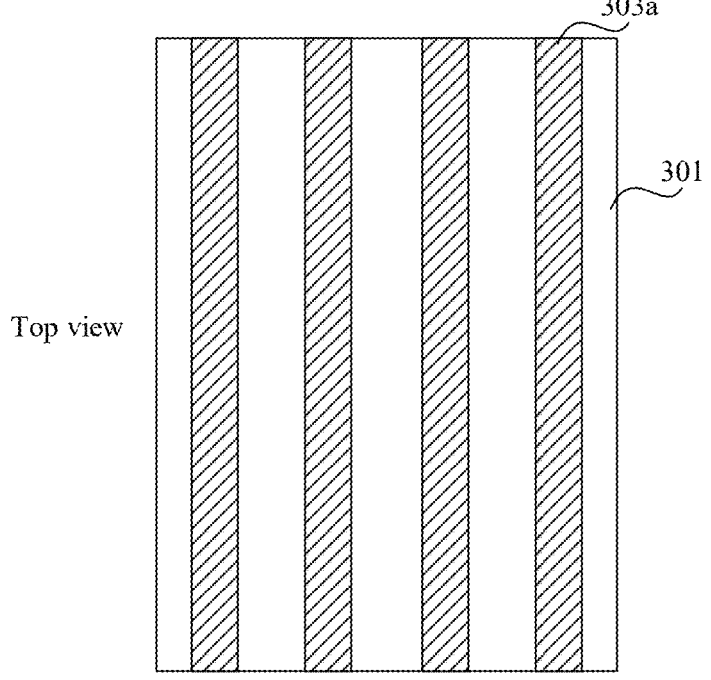
FIG. 6 is a schematic diagram of distribution of a second warpage modulation structure 303 on a chip 301 according to an embodiment of the present disclosure.
Figure 6:
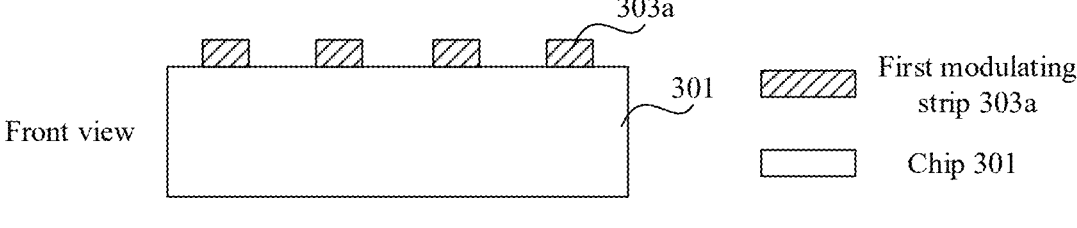

In implementation 1, if the substrate 302 is warped in a direction, the warpage modulation structure 303 may be a strip-shaped structure, and the warpage modulation structure 303 may include a plurality of first modulation strips 303*a* arranged in parallel. For example, a quantity of the first modulation strips 303*a* is four. When implementation 1 is used, distribution of the warpage modulation structure 303 on the chip 301 may be shown in FIG. 6.

According to implementation 1, warpage of the chip 301 in a direction parallel to the first modulation strips 303*a* can be modulated.

In this embodiment of the present disclosure, the plurality of first modulation strips 303*a* may be arranged in a plurality of manners. For example, the plurality of first modulation strips 303*a* may be arranged with equal spacings or arranged with different spacings. For another example, the plurality of first modulation strips 303*a* may be parallel to an edge of the chip 301, or may be at an angle with an edge of the chip 301.

In a possible implementation, the plurality of first modulation strips 303*a* may be arranged with equal spacings, and the plurality of first modulation strips 303*a* are parallel to two edges of the chip 301.

In this embodiment of the present disclosure, the chip 301 is considered as a rectangular plate with a specific thickness, and the first modulation strips 303*a* are parallel to the two edges of the chip 301. To be specific, the first modulation strips 303*a* are parallel to two edges that are of the chip 301 and that are parallel to each other. In another implementation of this embodiment of the present disclosure, that the modulation strips are parallel to the two edges of the chip 301 also has a same meaning, and details are not described later.

A length of the first modulation strips 303*a* may be the same as or less than a length of the two edges. It is not difficult to understand that, a longer length of the first modulation strips 303*a* leads to a larger quantity of bumps covered by the first modulation strips 303*a*, and therefore, a stronger modulation effect on the warpage of the chip 301 leads to a lower proportion of flip chip bond nonwetting of the chip 301.

In a possible example, two ends of each of the plurality of first modulation strips 303*a* are respectively adjacent to two other edges other than the two edges of the chip 301. In this case, the length of the first modulation strips 303*a* is the same as the length of the foregoing two edges. That is, it is assumed that four edges of the chip 301 are A, B, C, and D, where A and C are parallel, and B and D are parallel. The plurality of first modulation strips 303*a* may be parallel to A and C, the length of the plurality of first modulation strips 303*a* is the same as a length of A or C, and the two ends of each of the plurality of first modulation strips 303*a* are respectively adjacent to B and D.

Implementation 2

In implementation 2, if the substrate 302 is warped into a bowl shape, the warpage modulation structure 303 may be a mesh-shaped structure, the warpage modulation structure 303 includes a plurality of first modulation strips 303*a* arranged in parallel and a plurality of second modulation strips 303*b* arranged in parallel, and the plurality of first modulation strips 303*a* respectively intersect with the plurality of second modulation strips 303*b*.

Figure 7:
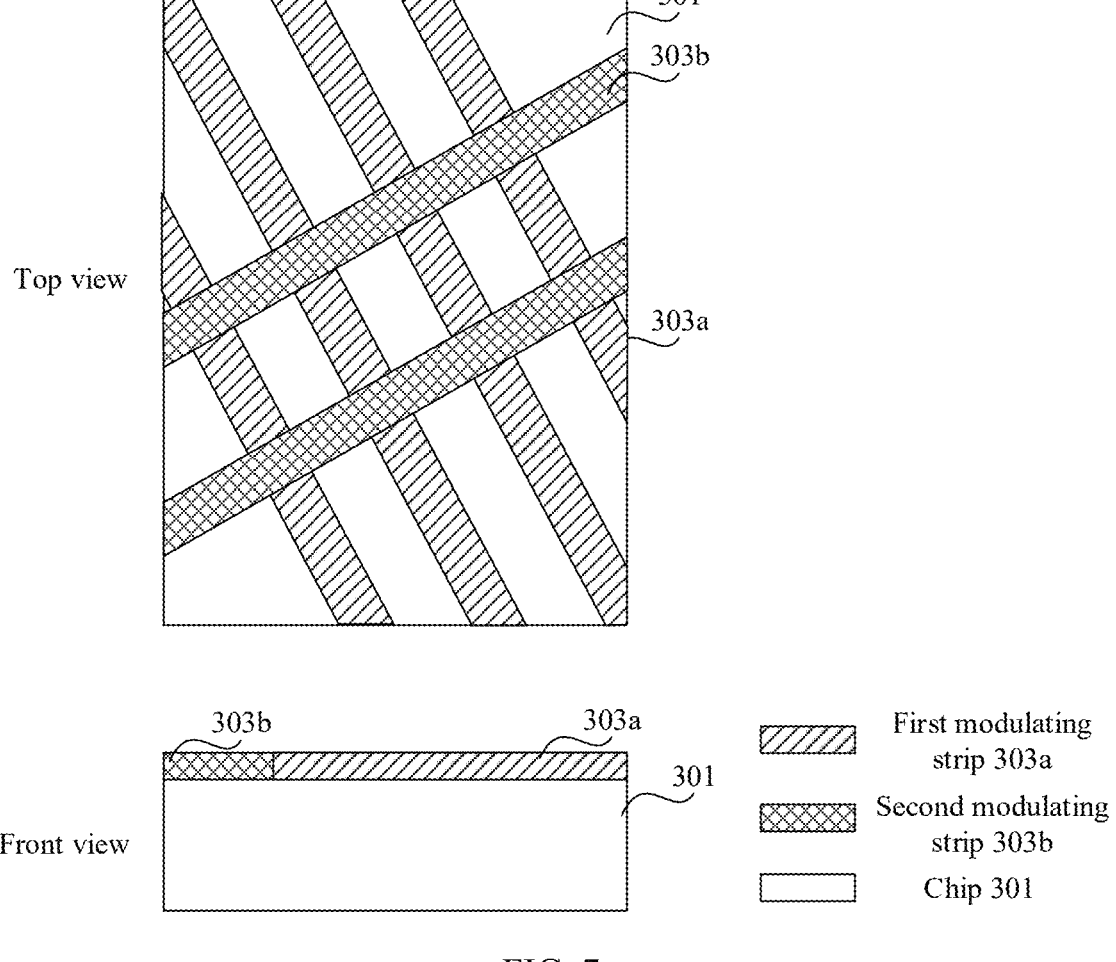
FIG. 7 is a schematic diagram of distribution of a third warpage modulation structure 303 on a chip 301 according to an embodiment of the present disclosure.

For example, a quantity of the first modulation strips 303*a* is four, and a quantity of the second modulation strips 303*b* is two. When implementation 2 is used, possible distribution of the warpage modulation structure 303 on the chip 301 may be shown in FIG. 7.

According to implementation 2, warpage of the chip 301 in a direction parallel to the plurality of first modulation strips 303*a* and in a direction parallel to the plurality of second modulation strips 303*b* can be modulated.

In this embodiment of the present disclosure, the plurality of first modulation strips 303*a* and the plurality of second modulation strips 303*b* may be separately arranged in a plurality of manners. The plurality of first modulation strips 303*a* may be arranged with equal spacings or arranged with different spacings, and the plurality of first modulation strips 303*a* may be parallel to an edge of the chip 301, or may be at an angle with an edge of the chip 301. Similarly, the plurality of second modulation strips 303*b* may be arranged with equal spacings or arranged with different spacings, and the plurality of second modulation strips 303*b* may be parallel to an edge of the chip 301, or may be at an angle with an edge of the chip 301.

Figure 8:
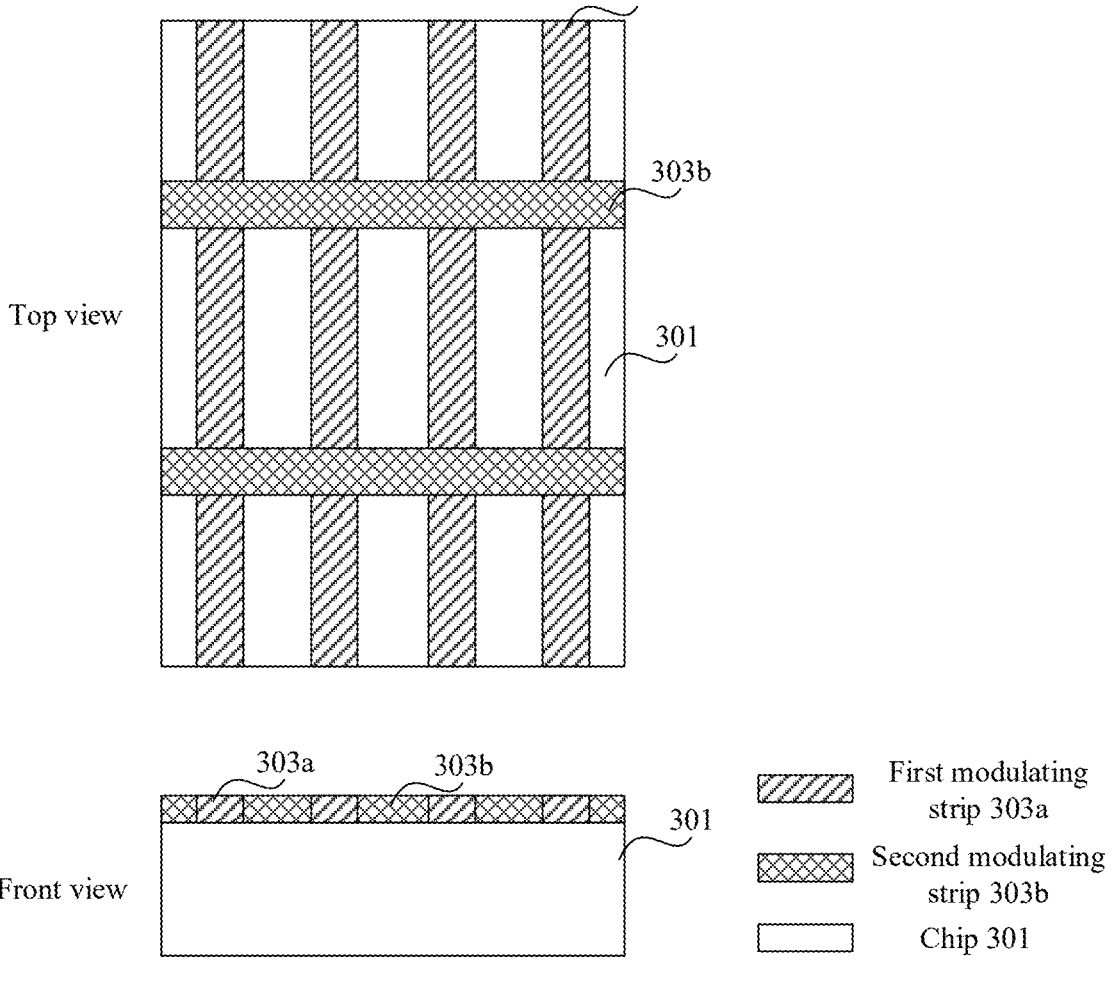
FIG. 8 is a schematic diagram of distribution of a fourth warpage modulation structure 303 on a chip 301 according to an embodiment of the present disclosure.

Optionally, the plurality of first modulation strips 303*a* may be respectively perpendicular to the plurality of second modulation strips 303b. For example, the quantity of the first modulation strips 303a is still four, and the quantity of the second modulation strips 303b is still two. In this case, possible distribution of the warpage modulation structure 303 on the chip 301 may be shown in FIG. 8.

If the plurality of first modulation strips 303a are respectively perpendicular to the plurality of second modulation strips 303b, the warpage modulation structure 303 may simultaneously modulate warpage in a direction parallel to the plurality of second modulation strips 303b and in a direction parallel to the plurality of first modulation strips 303a.

Further, the plurality of first modulation strips 303a may be arranged with equal spacings, the plurality of first modulation strips 303a may be parallel to two edges of the chip 301, and the plurality of second modulation strips 303b may be arranged with equal spacings.

In the foregoing implementation, two ends of each of the plurality of first modulation strips 303a may be respectively adjacent to two other edges other than the foregoing two edges of the chip 301, and two ends of each of the plurality of second modulation strips 303b may be respectively adjacent to the foregoing two edges. That is, it is assumed that four edges of the chip 301 are A, B, C, and D, where A and C are parallel, and B and D are parallel. The plurality of first modulation strips 303a may be parallel to A and C, and the two ends of each of the plurality of first modulation strips 303a are respectively adjacent to B and D. In addition, the two ends of each of the plurality of second modulation strips 303b are respectively adjacent to A and C.

When the plurality of first modulation strips 303a and the plurality of second modulation strips 303b are separately adjacent to the edges of the chip 301, a quantity of bumps covered by the warpage modulation structure 303 is large. Therefore, a modulation effect on the warpage of the chip 301 is strong, and a proportion of flip chip bond nonwetting of the chip 301 is low.

It should be noted that, in the accompanying drawings of this embodiment of the present disclosure, a part in which the first modulation strip 303a overlaps with the second modulation strip 303b may be considered as both an integral part of the first modulation strip 303a and an integral part of the second modulation strip 303b. As described above, the warpage modulation structure 303 may be formed in a manner of performing exposure, development, or laser cutting on a material layer (for example, a polymer layer). Therefore, the warpage modulation structure 303 is a single-layer layer-shaped, strip-shaped, or mesh-shaped structure, and modulation strips do not overlap with each other in the warpage modulation structure 303. The reference in this embodiment of the present disclosure to the first modulation strips 303a and the second modulation strips 303b is intended to describe a specific form of the mesh-shaped warpage modulation structure 303, and does not indicate that the part in which the first modulation strip 303a overlaps with the second modulation strip 303b has a double-layer structure in actual application.

Implementation 3

In implementation 3, if the substrate 302 is warped into a bowl shape and has twist (to be specific, warpage at diagonal locations), the warpage modulation structure 303 may be a mesh-shaped structure, and the warpage modulation structure 303 includes a plurality of first modulation strips 303a arranged in parallel and a plurality of second modulation strips 303b arranged in parallel: the plurality of first modulation strips 303a are respectively perpendicular to the plurality of second modulation strips 303b, and the plurality of first modulation strips 303a are parallel to two edges of the chip 301; and some second modulation strips 303b in the plurality of second modulation strips 303b intersect with some first modulation strips 303a in the plurality of first modulation strips 303a.

For example, both a quantity of the plurality of first modulation strips 303a and a quantity of the plurality of second modulation strips 303b are five, and a quantity of a first portion of the second modulation strips 303b is four. When implementation 3 is used, possible distribution of the warpage modulation structure 303 on the chip 301 may be shown in FIG. 9. In the schematic diagram of FIG. 9, twist occurs at a lower left corner and an upper right corner of the substrate 302, and the second modulation strips 303b intersected with some first modulation strips 303a are distributed at a lower left corner and an upper right corner of the chip 301.

According to implementation 3, warpage of the chip 301 in a direction parallel to the plurality of second modulation strips 303b and in a direction parallel to the plurality of first modulation strips 303a can be modulated. In addition, twist of the chip 301 can be further modulated.

It can be learned from the foregoing description that, in implementation 3, lengths of the plurality of second modulation strips 303b are different. Some second modulation strips 303b intersect with only some first modulation strips 303a, and a length of these second modulation strips 303b is shorter. Some second modulation strips 303b intersect with all the first modulation strips 303a, and a length of these second modulation strips 303b is longer. In this way, the second modulation strips 303b with the shorter length may modulate only warpage within a coverage area of the second modulation strips 303b. For the entire chip 301, the second modulation strips 303b with the shorter length may modulate local warpage on the chip 301, for example, twist.

Optionally, the plurality of first modulation strips 303a may be arranged with equal spacings.

It should be noted that, the foregoing three implementations are merely examples. During specific implementation, the warpage modulation structure 303 may be disposed as structures that have different forms/patterns based on the warpage degree of the chip 301 and the warpage degree of the substrate 302. Details are not described herein.

In conclusion, in the chip packaging apparatus 300 provided in this embodiment of the present disclosure, because the coefficient of thermal expansion of the warpage modulation structure 303 is greater than the coefficient of thermal expansion of the chip 301, in a reflow process of the chip packaging apparatus 300, the warpage modulation structure 303 disposed on the surface that is of the chip 301 and that is opposite to the substrate 302 is expanded with heat. Compared with an expansion degree in the conventional technology, the expansion degree of the surface that is of the chip 301 and that is opposite to the substrate 302 becomes larger, thereby modulation the warpage of the chip 301 in the direction from the surface that faces the substrate 302 to the surface that is opposite to the substrate 302. In other words, the warpage degree of the chip 301 is decreased. Therefore, the warpage degree of the chip 301 is close to the warpage degree of the substrate 302, and the problem of mismatch between the warpage degree of the chip 301 and the warpage degree of the substrate 302 is alleviated.

In particular, local or overall warpage and unidirectional or multi-directional warpage of the chip 301 may be further modulated to different extents by setting the forms/patterns such as a size, a thickness, and a spacing of the warpage modulation structure 303, so that the warpage degree of the chip 301 is closer to the warpage degree of the substrate 302. In addition, compared with a warpage degree of a chip in the conventional technology, because the warpage degree of the chip 301 is smaller, overall warpage of the chip packaging apparatus 300 may be further alleviated by using the solution provided in this embodiment of the present disclosure.

In addition, if the warpage modulation structure 303 is a strip-shaped structure or a mesh-shaped structure, when the chip packaging apparatus 300 is formed through epoxy encapsulation package, a molding direction may be the same as a direction of a modulation strip included in the warpage modulation structure 303. To be specific, liquid may flow along a gap of the strip-shaped structure or the mesh-shaped structure during injection molding, so that epoxy encapsulation package is more easily implemented.

Figure 10:
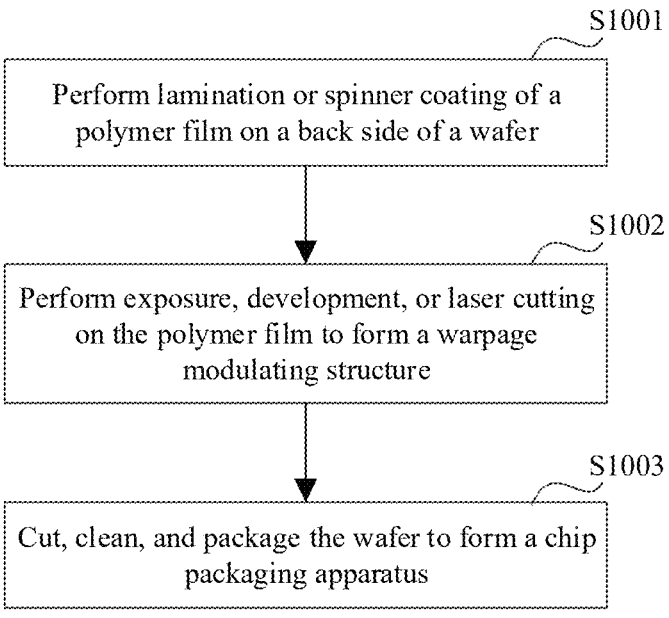
FIG. 10 is a schematic flowchart of a chip packaging apparatus preparation method according to an embodiment of the present disclosure.

Based on a same inventive concept, an embodiment of the present disclosure further provides a chip packaging apparatus preparation method, to prepare the foregoing chip packaging apparatus 300. Refer to FIG. 10. The method includes the following steps.

S1001. Perform lamination or spinner coating of a polymer film on a back side of a wafer.

The wafer includes a plurality of chips, that is, a plurality of chips may be formed after the wafer is cut.

S1002. Perform exposure, development, or laser cutting on the polymer film to form a warpage modulation structure.

A coefficient of thermal expansion of the warpage modulation structure is greater than a coefficient of thermal expansion of the wafer. Specifically, the coefficient of thermal expansion of the warpage modulation structure is greater than a coefficient of thermal expansion of a material whose coefficient of thermal expansion is the largest in materials included in the wafer. For example, the wafer is mainly made from two types of materials: copper and silicon, and the copper has a largest coefficient of thermal expansion in the materials included in the wafer. In this case, the coefficient of thermal expansion of the warpage modulation structure is greater than the coefficient of thermal expansion of the copper.

Because the wafer may be cut into the plurality of chips, in S1002, exposure, development, or laser cutting is performed on the polymer film, and a plurality of warpage modulation structures may be formed for the plurality of chips, so that the warpage modulation structures may have different forms/patterns.

S1003. Cut, clean, and package the wafer to form a chip packaging apparatus.

Optionally, before the performing lamination or spinner coating of a polymer film on a back side of a wafer in S1001, the method further includes: separately measuring a warpage degree of a substrate and a warpage degree of a chip: determining a mismatch degree based on the warpage degree of the substrate and the warpage degree of the chip; and determining a material type and a shape feature of the warpage modulation structure based on the mismatch degree.

The step of separately measuring a warpage degree of a substrate and a warpage degree of a chip may be considered as a step of an experimental test. The chip and the substrate that are used in this step are merely used to test the mismatch degree between the warpage degrees thereof. For example, the chip packaging apparatus may be first prepared by using a solution in the conventional technology, then the warpage degree of the chip and the warpage degree of the substrate in the chip packaging apparatus are tested, and the material type and the shape feature of the warpage modulation structure are analyzed based on a test result. Specifically, the material type and the shape feature of the warpage modulation structure may be analyzed in a computer simulation manner.

Specifically, the performing exposure, development, or laser cutting on the polymer film to form a warpage modulation structure in S1002 may be implemented in the following manner: performing exposure, development, or laser cutting on the polymer film to form a strip-shaped structure. In other words, the warpage modulation structure is a strip-shaped structure. Specifically, the strip-shaped structure includes a plurality of first modulation strips arranged in parallel.

Specifically, the performing exposure, development, or laser cutting on the polymer film to form a warpage modulation structure in S1002 may be implemented in the following manner: performing exposure, development, or laser cutting on the polymer film to form a mesh-shaped structure. In other words, the warpage modulation structure is a mesh-shaped structure. Specifically, the mesh-shaped structure includes a plurality of first modulation strips arranged in parallel and a plurality of second modulation strips arranged in parallel, and the plurality of first modulation strips respectively intersect with the plurality of second modulation strips.

Specifically, the performing exposure, development, or laser cutting on the polymer film to form a warpage modulation structure in S1002 may be implemented in the following manner: performing exposure, development, or laser cutting on the polymer film to form a mesh-shaped structure. In other words, the warpage modulation structure is a mesh-shaped structure. Specifically, the mesh-shaped structure includes a plurality of first modulation strips arranged in parallel and a plurality of second modulation strips arranged in parallel: the plurality of first modulation strips are respectively perpendicular to the plurality of second modulation strips, and the plurality of first modulation strips are parallel to two edges of the chip; and some second modulation strips in the plurality of second modulation strips intersect with some first modulation strips in the plurality of first modulation strips.

In addition, for another implementation of the warpage modulation structure formed in S1002, refer to related descriptions of the foregoing warpage modulation structure 303. Details are not described herein again.

It should be noted that, the method shown in FIG. 10 may be used to prepare the chip packaging apparatus 300 shown in FIG. 3. For implementations and technical effects that are not described in detail in the method shown in FIG. 10, refer to the related descriptions in the chip packaging apparatus 300 shown in FIG. 3.

Figure 9:
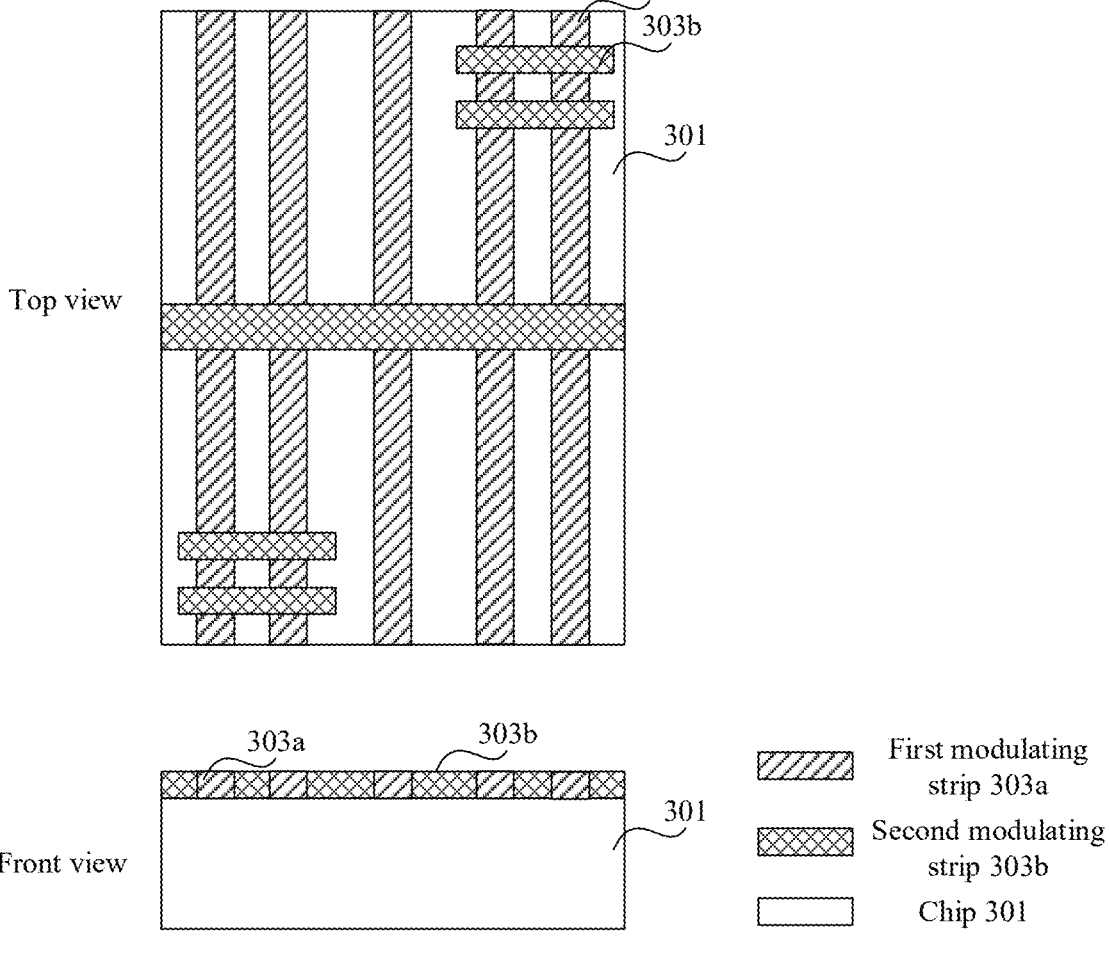
FIG. 9 is a schematic diagram of distribution of a fifth warpage modulation structure 303 on a chip 301 according to an embodiment of the present disclosure.

The following gives a specific process of preparing the chip packaging apparatus 300 by using an example in which the warpage modulation structure 303 designed in the chip packaging apparatus 300 is the solution shown in FIG. 9. The process may be considered as a specific example of the method shown in FIG. 10. It may be understood that, the following described process steps are merely used to describe feasibility of the chip packaging apparatus 300 provided in the embodiments of the present disclosure, and do not constitute a limitation on the chip packaging apparatus 300.

Figure 11:
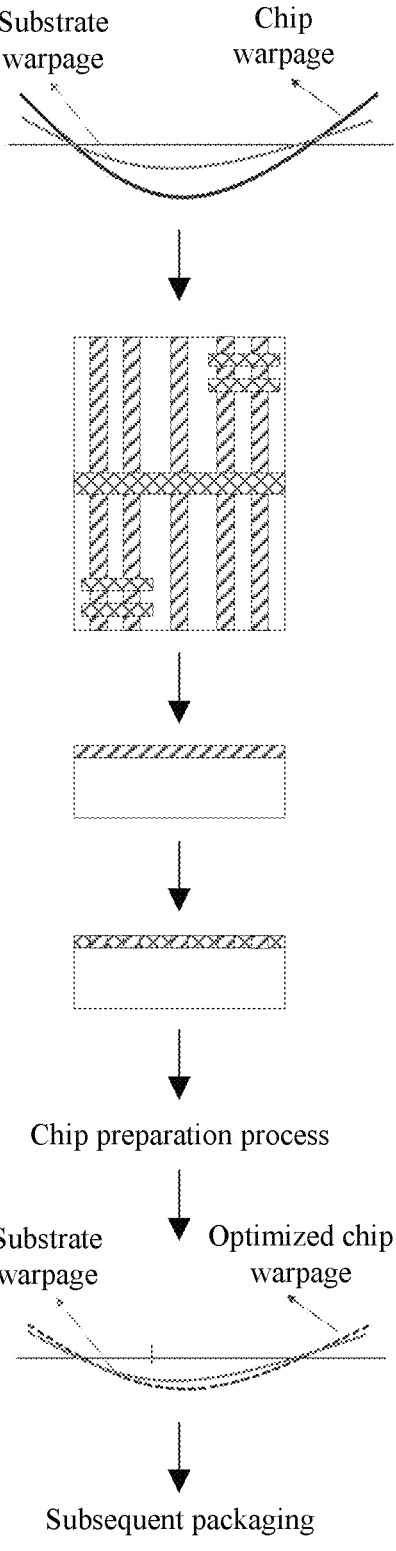
FIG. 11 is another schematic flowchart of a chip packaging apparatus preparation method according to an embodiment of the present disclosure.

Specifically, the process may be shown in FIG. 11.

1. Measure a warpage degree of a thinned chip and a warpage degree of a substrate, and analyze severity of a mismatch between the warpage degree of the thinned chip and the warpage degree of the substrate.

Step 1 may be considered as a step of an experimental test. The chip and the substrate in step 1 are merely used to test a mismatch degree between the warpage degree of the thinned chip and the warpage degree of the substrate, and are not the chip and the substrate that are finally prepared in the chip packaging apparatus 300.

2. Analyze required types of polymer materials (for example, polyimide, epoxy, and phenolic aldehyde) and a corresponding shape feature of a polymer mesh through computer simulation.

The shape feature of the polymer mesh is affected by the warpage degree of the substrate obtained through analysis in step 1. For example, if the substrate is warped into a regular bowl shape, the polymer mesh is also a corresponding regular bowl shape, and the warpage degree of the chip is emphatically decreased: or if twist of the substrate is serious, the polymer mesh may use the shape shown in the example in FIG. 9.

3. Perform lamination or spinner coating (spinner coating) of a polymer film on a back side of a thinned wafer.

A plurality of chips may be obtained by subsequently cutting the wafer. Therefore, when the polymer mesh is designed in step 2, different designs may be made for polymer meshes of the plurality of chips on the wafer.

4. Form a required mesh-shaped polymer film in an exposure/development manner or a laser cutting manner, and heat and cure the mesh-shaped polymer film.

The polymer meshes for the plurality of chips on the wafer may be formed by performing step 4, and each polymer mesh is configured to modulate a warpage degree of a chip corresponding to the polymer mesh.

5. Perform a chip preparation process, including cutting and cleaning.

6. Measure optimized chip warpage for each cut chip, to ensure that warpage thereof matches warpage of the substrate.

7. Perform a subsequent packaging step, and prepare the chip packaging apparatus 300, where the warpage modulation structure 303 in the chip packaging apparatus 300 may be shown in FIG. 9. For this step, refer to the conventional technology. Details are not described herein.

What is claimed is:

1. A chip packaging apparatus, comprising:
a chip,
a substrate, wherein a surface that is of the chip and that faces the substrate is electrically connected to the substrate by a plurality of bumps disposed between the chip and the substrate;
a warpage modulation structure comprising a plurality of flexible portions having a similar height and width arranged in a parallel pattern, formed of one of a polyimide, or a phenolic aldehyde and is disposed on a surface that is of the chip and that is opposite to the substrate and bumps that connect the chip to the substrate, wherein a coefficient of thermal expansion of the warpage modulation structure is greater than a coefficient of thermal expansion of the chip.

2. The chip packaging apparatus of claim 1, wherein the coefficient of thermal expansion of the warpage modulation structure is greater than a coefficient of thermal expansion of a metal layer of the chip.

3. The chip packaging apparatus of claim 1, wherein the warpage modulation structure comprises a plurality of first modulation strips arranged in a parallel pattern.

4. The chip packaging apparatus of claim 1, wherein the warpage modulation structure comprises two linearly disposed portions on the surface of the chip.

5. The chip packaging apparatus of claim 1, wherein the warpage modulation structure comprises a plurality of first modulation strips arranged in parallel and a plurality of second modulation strips arranged in parallel, and the plurality of first modulation strips respectively intersect with the plurality of second modulation strips in a diagonal pattern.

6. The chip packaging apparatus of claim 5, wherein the plurality of first modulation strips are respectively perpendicular to the plurality of second modulation strips.

7. The chip packaging apparatus of claim 6, wherein the plurality of first modulation strips are arranged with equal spacings, the plurality of first modulation strips are parallel to two edges of the chip, and the plurality of second modulation strips are arranged with equal spacings.

8. The chip packaging apparatus of claim 1, wherein the warpage modulation structure is a mesh-shaped structure, and the warpage modulation structure comprises a plurality of first modulation strips arranged in parallel and a plurality of second modulation strips arranged in parallel;
the plurality of first modulation strips are respectively perpendicular to the plurality of second modulation strips, and the plurality of first modulation strips are parallel to two edges of the chip; and some second modulation strips in the plurality of second modulation strips intersect with some first modulation strips in the plurality of first modulation strips.

9. The chip packaging apparatus of claim 8, wherein the plurality of first modulation strips are arranged with equal spacings.

10. The chip packaging apparatus of claim 1, wherein a material of the warpage modulation structure is a polymer material.

11. The chip packaging apparatus of claim 1 wherein the warpage modulation structure is sized to be smaller than the chip.

12. The chip packaging apparatus of claim 1 wherein the warpage modulation structure is comprised of the polyimide.

13. The chip packaging apparatus of claim 1 wherein the warpage modulation structure is comprised of the phenolic aldehyde.

14. A chip packaging apparatus, comprising:
a chip,
a substrate, wherein a surface that is of the chip and that faces the substrate is electrically connected to the substrate by a plurality of bumps disposed between the chip and the substrate; and
a plurality of warpage modulation strips comprising flexible material having a similar height and width arranged in a parallel pattern, formed of one of a polyimide or a phenolic aldehyde that is disposed on a surface that is of the chip and that is opposite to the substrate and bumps that connect the chip to the substrate, wherein a coefficient of thermal expansion of the plurality of warpage modulation strips is greater than a coefficient of thermal expansion of the chip and wherein each of the plurality of warpage modulation strips are sized to be smaller than the chip.

* * * * *